United States Patent [19]

Ullmann et al.

[11] E Patent Number: Re. 32,747

[45] Reissued Date of Patent: Sep. 13, 1988

[54] SYNTHETIC-RESIN AND METALLIC LAYERED HOUSING FOR HAND-HELD APPLIANCE

[75] Inventors: Roland Ullmann, Offenbach; Klaus Zimmermann, Bremthal, both of Fed. Rep. of Germany

[73] Assignee: Braun Aktiengesellschaft, Kronberg, Fed. Rep. of Germany

[21] Appl. No.: 880,946

[22] Filed: Jun. 25, 1986

Related U.S. Patent Documents

Reissue of:

[64] Patent No.: 4,388,509
Issued: Jun. 14, 1983
Appl. No.: 338,900
Filed: Jan. 12, 1982

U.S. Applications:

[63] Continuation of Ser. No. 743,202, Jun. 10, 1985, abandoned, which is a continuation of Ser. No. 938,103, Aug. 30, 1978, abandoned.

[30] Foreign Application Priority Data

Aug. 31, 1977 [DE] Fed. Rep. of Germany ..... 2739137

[51] Int. Cl.[4] ..... H01H 9/04

[52] U.S. Cl. ..... 200/157; 200/302.2; 200/52 R; 200/61.85; 16/110 R; 220/453; 428/138

[58] Field of Search ..... 16/110 R, 114 R, 116 R, 16/DIG. 12, DIG. 18, DIG. 24; 200/302.1, 302.2, 157, 61.85–61.88, 52 R, 329, 340; 220/415, 453–454, 461; 428/209, 137, 138; 128/38, 66

[56] References Cited

U.S. PATENT DOCUMENTS

| | | | |
|---|---|---|---|
| 272,033 | 2/1883 | Edge | 428/138 X |
| 1,184,321 | 8/1915 | Chapin . | |
| 1,278,270 | 9/1918 | Wilber . | |
| 2,125,783 | 8/1938 | Heeman | 16/111 R X |
| 2,207,269 | 7/1940 | Schiff . | |
| 2,750,480 | 6/1956 | Freeman . | |
| 2,769,882 | 11/1956 | Vitus . | |
| 3,024,337 | 3/1962 | Goudy . | |
| 3,185,001 | 5/1965 | Viator | 81/127 |
| 3,643,041 | 5/1972 | Jackson | 200/5 A |
| 3,699,294 | 10/1972 | Sudduth | 200/302.2 |
| 3,753,846 | 8/1973 | Trouilhet | 161/111 |
| 3,959,610 | 5/1976 | Finnegan | 200/5 A |
| 3,978,297 | 8/1976 | Lynn et al. | 200/5 A |
| 3,995,126 | 11/1976 | Larson | 200/5 A |
| 4,184,321 | 1/1980 | Tarusawa | 58/152 R |
| 4,197,968 | 4/1980 | Ullman et al. | 224/178 |

FOREIGN PATENT DOCUMENTS

| | | | |
|---|---|---|---|
| 1149273 | 5/1963 | Fed. Rep. of Germany . | |
| 1163706 | 2/1964 | Fed. Rep. of Germany . | |
| 1640444 | 3/1966 | Fed. Rep. of Germany . | |
| 2413016 | 4/1974 | Fed. Rep. of Germany . | |
| 2448627 | 10/1974 | Fed. Rep. of Germany . | |
| 2558962 | 1/1977 | Fed. Rep. of Germany . | |
| 2846354 | 5/1980 | Fed. Rep. of Germany | 200/159 B |
| 2284177 | 9/1975 | France . | |
| 539333 | 8/1973 | Switzerland . | |
| 1125973 | 9/1968 | United Kingdom | 428/137 |

*Primary Examiner*—Henry J. Recla
*Assistant Examiner*—Ernest G. Cusick
*Attorney, Agent, or Firm*—Raymond J. DeVellis

[57] ABSTRACT

A housing has a wall constituted by a rigid metal plate formed with an array of throughgoing perforations and by a flexible synthetic-resin sheet overlying the inner face of the rigid wall and having a multiplicity of projections each extending through a respective perforation and beyond the outer surface of the rigid plate. Futhermore the flexible sheet may be inwardly deflectable to actuate a switch in the housing.

7 Claims, 3 Drawing Sheets

FIG.3
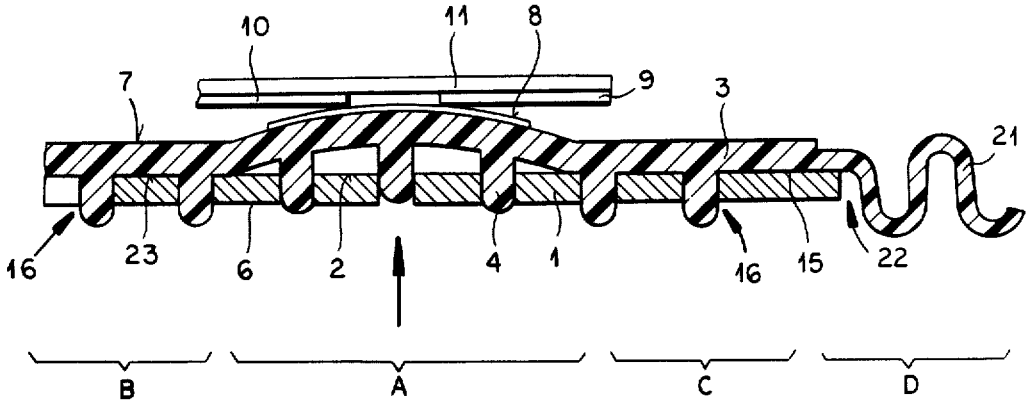
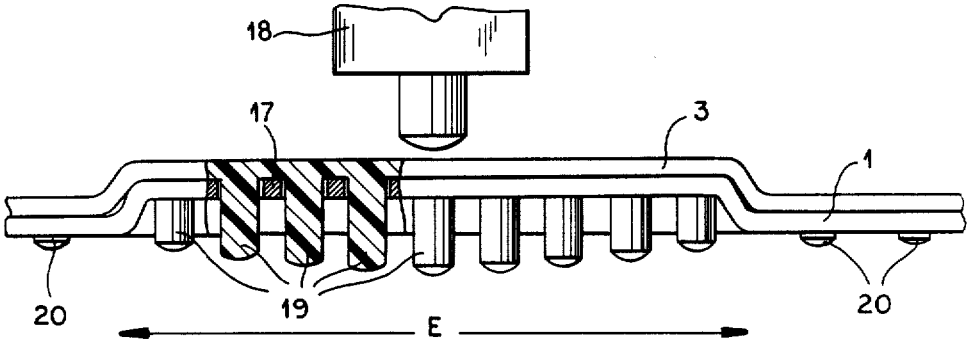
FIG.4

SYNTHETIC-RESIN AND METALLIC LAYERED HOUSING FOR HAND-HELD APPLIANCE

Matter enclosed in heavy brackets [ ] appears in the original patent but forms no part of this reissue specification; matter printed in italics indicates the additions made by reissue.

*This reissue application is a continuation, of Reissue application Ser. No. 743,202, filed Jun. 10, 1985 abandoned.*

This *regular application* is a continuation of *patent* application Ser. No. 938,103, filed Aug. 30, 1978 now abandoned.

FIELD OF THE INVENTION

The present invention relates to a housing for a hand-held appliance such as an electric shaver, electric toothbrush, camera, or even calculator.

BACKGROUND OF THE INVENTION

It is known to cast the housing of a hand-held appliance of the type listed above from metal to make a very solid and strong housing, or to deep draw or stamp sheet metal to make a rigid metal housing. In order to dress up the appearance of such a housing, which frequently tends to scratch readily, it is known to laminate attractive and normally textured synthetic-resin sheets over the metal structure.

Such housings are frequently found objectionable because they do not allow sweat or, in the case of an electric toothbrush or the like, other liquids to dissipate. Such liquids also often lead to corrosion and an unattractive appearance.

Another difficulty is that it is almost invariably necessary to provide at least one externally operable switch in such a housing. In a hand-held calculator in particular it is necessary to provide an entire keyboard. Forming a tight seal around the operating button of such a switch or of such switches is an onerous task that normally increases production costs considerably while still yielding unsatisfactory results. Any moisture entering around the switch-actuating member can lead quickly to component failure, and can even in some instances present a real danger of a serious electrical shock to the user.

OBJECTS OF THE INVENTION

It is therefore an object of the instant invention to provide an improved housing for a hand-held appliance of the above-described and listed types.

Another object is the provision of such a housing which is rugged yet agreeable to the touch, and wherein it is possible to provide externally operable switches which are adequately sealed.

SUMMARY OF THE INVENTION

These objects are attained according to the instant invention in a housing having a two-layer wall that has a substantially rigid and normally metallic layer formed with an array of perforations and an elastomeric or flexible and normally nonmetallic layer formed with a multiplicity of bosses each of which engages in and projects through a respective one of the perforations. Such a structure is generally described in our copending and commonly assigned patent application Ser. No. 901,703 filed May 1, 1978, now U.S. Pat. No. 4,197,968, whose entire disclosure is herewith incorporated in the present application. In the housing of the instant invention, however contrary to the disclosure of our prior patent, the flexible bossed sheet lies against the inner face of the rigid housing and its bosses project beyond the outer face thereof, so that the tips or outer ends of the bosses are presented on the outside and constitute an agreeable and attractice surface for the user to hold. In fact such a two-part housing does not have the so-called "sweaty" feel of the standard all-metal or all-plastic housings, as air spaces are left between the fingertips of the user and the housing itself.

It is possible according to the instant invention to provide a switch in such a housing simply by allowing a portion of the inner sheet to be inwardly deflectable, and by providing a push-type switch at this inwardly deflectable region. To indicate the location of the switch, the bosses at the switch location are made longer than elsewhere, so as to provide a bump on the outer surface of the housing. In such an arrangement the sheet is secured around the switch location to the inner face of the outer metal plate constituting the housing wall, the only depressible bosses lying in the vicinity of the switch location where the sheet is not fixed to the metal plate.

According to yet another feature of the invention such a switch can be constituted simply by providing an electrically conductive element or foil on the inner surface of the inner flexible sheet, and a pair of contacts normally spaced slightly inwardly of this conductive region. Inward depression of the sheet at these contacts will bridge the contacts with the conductive surface and close the circuit. A particular advantage of the instant invention is that the housing can be completely watertight at the switch, as the inner sheet can be continuous so that even if some water or other liquid makes its way through any of the perforations around the respective boss, separation of the inner flexible sheet is impossible. In fact it is possible to provide an entire keyboard in this manner which can be fully watertight, and even gastight. The switch or switches inside the housing, as well as other structure, are therefore hermetically sealed in.

BRIEF DESCRIPTION OF THE DRAWING

The above and other features of our invention will now be described in detail with reference to the accompanying drawing in which:

FIG. 3 is a section through the housing of FIG. 1 in another operative position; [and]

FIG. 4 is a cross section through a portion of another housing according to this invention[.] *and*

*FIG. 5 is a perspective view, partial in section, of a dry shaver, in accordance with this invention.*

SPECIFIC DESCRIPTION

Figure 1:
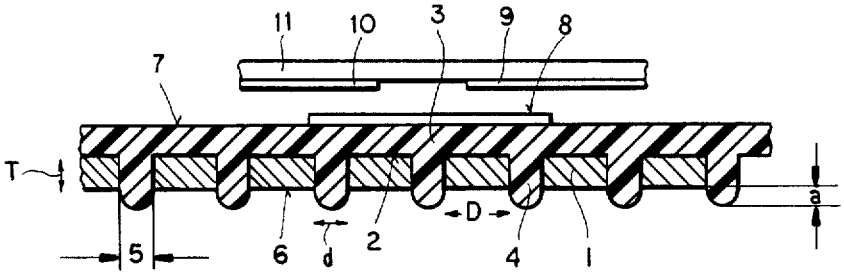
FIGS. 1 and 2 are cross sections through portions of a housing according to this invention.

As shown in FIGS. 1 and 3 a housing according to this invention has an outer aluminum wall constituted by a plate 1 having an inner face 2 and an outer face 6 and formed with a substantially uniform array of throughgoing cylindrical perforations 5. An elastomeric synthetic-resin sheet 3 is secured to this plate 1 and has an outer face 15 bearing on the inner face 2, an inner face 7, and a multiplicity of cylindrical and rounded bosses or projections 4 each extending through a respective hole 5 and projecting by a distance a beyond the face 6. The distance a is equal to between one-quarter and three-quarters of the thickness T of the plate 1 as mentioned in our above-cited patent. The rounded tips of these projections 4 are normally all that contacts the fingers of the user, as the distance D between adjacent projections is equal to at most three times the diameter d of the projections 4 and of the holes 5, which in turn is generally equal to T. The exposed metal between the projections 4 nonetheless creates a very attractive appearance, and the projections 4 will protect it from being scratched.

FIGS. 1 and 3 further show how the inner face 7 of the flexible sheet 3 can be provided with a conductive, here copper, foil 8 engageable with a pair of contacts 9 and 10 carried on a mount 11 fixed in the housing. The elements 8–10 therefore form a very simple switch which is closed when the bosses 4 opposite the foil 8 are deflected inwardly as shown in FIG. 3 so that foil 8 bridges the contacts 9 and 10.

To this end the sheet 3 is not connected to the face 2 in the region A at the switch, but is bonded thereto at regions B and C flanking this region A by means of a glue bond 23; thus, the bosses 4 in these latter two regions cannot be depressed into plate 1. Furthermore the outer edge portions 21 of the sheet 3 are formed as a flexible and relatively thin cut 22 for securing of this housing wall in a housing according to this invention while forming a hermetic seal. The joints 16 around the projections 4 in region B and C are very tight and may be sealed.

Figure 2:
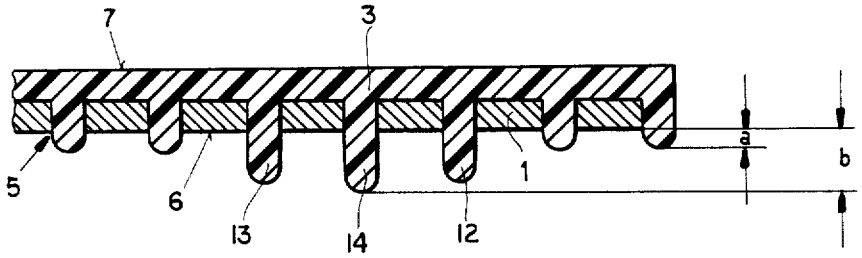

FIG. 2 shows an arrangement substantially identical to that of FIGS. 1 and 3, except that some of the projections 4 are replaced by projections 12–14 which are extended by a distance b greater than the distance a beyond the face 6. Such extra-length projections 12–14 serve to indicate the location of a switch, forming a bump easily seen and felt by the user. The projections are progressively longer toward the center of the bump thus formed.

FIG. 4 shows another arrangement wherein the metallic plate 1 is formed with a recess 17 and wherein the sheet 3 overlying its inner face has projections 19 of greater length at this recess 17 than its nondepressible projections 20 surronding the recess 17. Furthermore the two layers 1 and 3 are not bonded together in the region E of the recess 17 as in FIG. 3. A standard push-button switch 18 is provided inside the housing adjacent the inner face of the sheet 3 for actuation when the sheet is elastically deformed inwardly normally to the housing wall.

*FIG. 5 is a perspective view of a dry shaver having the two-layer housing of FIG. 1 and defining an enclosed internal open space 24.*

We claim:

1. In a switchable hand-held appliance, in combination:

a housing having a rigid wall formed with an array of perforations extending between an inner and an outer face thereof;

an elastomeric nonmetallic sheet overlying said wall at said inner face thereof and formed with a multiplicity of bosses each penetrating a respective perforation and extending beyond said outer face; and switch means in said housing juxtaposed with a portion of said sheet carrying some of said bosses, said portion being inwardly deflectable away from said wall by finger pressure exerted upon said some of said bosses for actuating said switch means, the remainder of said sheet being fixed to said wall and preventing a depression of all other bosses.

2. The combination defined in claim 1 wherein said some of said bosses project farther beyond said outer face than to the other bosses on the remainder of said sheet.

3. The combination defined in claim 2 wherein the projecting parts of said some of said bosses progressively increase in length toward the middle of said portion of said sheet.

4. The combination defined in claim 1, 2 or 3 wherein said wall forms a recess adjacent said portion of said sheet, said some of said bosses projecting from said recess.

5. The combination defined in claim 1 wherein said switch means includes a metallic foil on a surface of a portion of said sheet opposite said wall.

*6. A two-layer housing for a hand-held appliance, said housing defining an enclosed internal open space, said housing comprising a substantially rigid housing wall, of a predetermined thickness, having an inner face and an outer face with an array of perforations extending between said faces, a continuous sheet of synthetic resin material, at least a portion of which is rigidly bonded to the inner face of said housing wall, said housing wall being continuous between said perforations, said sheet having a multiplicity of individual upstanding bosses, each said boss having a predetermined diameter and each said boss extending through a respective perforation and projecting one-quarter to three-quarters the thickness of said housing wall beyond said outer face and said bosses being spaced at most about three times the diameter of said bosses from each other, each said upstanding boss of said continuous sheet of synthetic resin material located on the portion of said sheet which is rigidly bonded to the inner face of said housing wall forming a tight and sealed connection with its respective perforation to hold said sheet and said bosses in position thereby rendering said bosses non-displaceable with repect to said respective perforations of said housing wall, and to prevent moisture from entering the internal open face of said housing.*

*7. The housing as defined in claim 6 wherein each said boss includes a rounded tip projecting beyond said outer face of said wall, and wherein each said individual upstanding boss is generally cylindrical.*

* * * * *